United States Patent [19]
Clark
[11] 3,911,461
[45] Oct. 7, 1975

[54] SEMICONDUCTOR DEVICE WITH IMPROVED REVERSE TRANSIENT CAPABILITY

[75] Inventor: Lowell E. Clark, Scottsdale, Ariz.
[73] Assignee: Motorola, Inc., Chicago, Ill.

[22] Filed: Nov. 7, 1974
[21] Appl. No.: 521,706

[52] U.S. Cl. .................... 357/13; 307/302; 357/34; 357/56; 357/65
[51] Int. Cl.²..H01L 29/06; H01L 29/40; H01L 29/72
[58] Field of Search ............. 357/13, 34, 52, 56, 63, 357/65; 307/302

[56] References Cited

UNITED STATES PATENTS

| | | | |
|---|---|---|---|
| 3,363,152 | 1/1968 | Lin | 357/34 |
| 3,758,831 | 9/1973 | Clark | 357/13 |

*Primary Examiner*—Siegfried H. Grimm
*Attorney, Agent, or Firm*—Vincent J. Rauner; Henry T. Olsen

[57] ABSTRACT

There is disclosed a semiconductor device, with especial reference to a transistor, with improved protection against short high-power reverse transients. This improvement is the result of providing a secondary punch-through breakdown mode which operates to the exclusion of an avalanche mode. In the improved device, punch-through breakdown current causes turn-off dissipation to be substantially uniform throughout the area of the device. The provision of a secondary punch-through breakdown is accomplished by reducing the total doping in one of the end regions of the device and by replacing the conventional heavily-doped semiconductor end regions with a suitable metallic contact. This technique is superior to previously described methods for accomplishing primary punch-through breakdown by reducing the number of base impurities because such an approach cannot allow independent control of the current gain of the device.

4 Claims, 9 Drawing Figures

SEMICONDUCTOR DEVICE WITH IMPROVED REVERSE TRANSIENT CAPABILITY

BACKGROUND OF THE INVENTION

This invention relates to semiconductor switching devices and more particularly to a method and apparatus for protecting transistors against reverse-biased transients which would ordinarily destroy them.

Semiconductor devices in general are very susceptible to destruction under transient conditions of contemporaneous high current and high voltage which exist especially on turn-off of conductive loads but which may also obtain under turn-on conditions. Although both the time interval and the total energy are limited so that the device would be expected to survive from a purely thermal point-of-view, if the power were uniformly dissipated across a substantial portion of the semiconductor chip, failures are commonplace and attributable to extreme power localization. Although some of these inhomogeneities are engendered by the turn-off process itself due to the lateral flow of turn-off base current, the state of the art understanding of the limiting mechanism is that the transport of emitter-injected majority carriers into the collector E-field region results in distortion of the low-current E field distribution so that the peak E field may no longer obtain at the collector-base metallurgical junction but perhaps at the juncture of the lightly-doped substrate. This can lead to a condition where the collector voltage collapses locally with a further increase in current density.

Since the collector voltage increases during turn-off of an inductive load, ionization will materially influence the current density as the voltage approaches the avalanche breakdown value. This current increase causes a thermal rise which causes a further current increase. Thus a number of different interacting mechanisms must be taken into account in order to minimize the propensity toward destructive secondary-breakdown during the turn-off phase.

It is the purpose of this invention to cause breakdown to result not from avalanche but from electrical punch-through of the lightly doped collector region with a metallic contact allowing the introduction of carriers in a uniform manner and of such a sign as to oppose the tendency of the electric field to be distorted at high current densities. By appropriate control of thicknesses and dopings, this punch-through breakdown is made to occur before the more destructive avalanche breakdown can occur. Punch-through breakdown tends to preclude the current localization associated with avalanche breakdown, so that the power dissipation is spread over the entire area of the device.

Prior disclosures have been made of schemes which result in electrical punch-through of a transistor base region. This is accomplished by reduction in the amount of base doping, which is difficult to control and results in high-current gains which are generally undesirable in power transistors.

In the preferred embodiment, there are structural improvements to the transistor which result in punch-through of the collector region in desired areas. These structural features include control over the total doping of the collector as well as the doping distribution. By these means, the reverse-biased current-carrying capabilities may be enhanced and made to approach more nearly the forward bias capabilities of the same device.

SUMMARY OF THE INVENTION

It is therefore an object of this invention to provide a transistor with an improved tolerance to excessive reverse bias conditions.

It is a still further object of this invention to provide a transistor with a secondary or collector punch-through mode of breakdown which occurs prior to any avalanche breakdown mechanism and therefore eliminates avalanche breakdown in the particular transistor.

It is a still further object of this invention to provide a transistor where secondary-punch is limited to certain areas of the transistor in order to secure optimum overall performance.

It is yet another object of this invention to provide a transistor structure which is cheaper to manufacture yet gives equal or better performance to conventional structures.

In accordance with the foregoing objects, there is provided a semiconductor device with improved reverse transient capability comprising a first and a second junction between the emitter base and collector regions, the collector region being lightly doped to a level of $10^{12}$ to $10^{13}$ atoms per square centimeter, and a refractory metal contact to said collector thereby providing uniform turn-off power dissipation. The device may be either a planar silicon transistor or a mesa type silicon transistor.

THE DRAWINGS

Further objects and advantages of the invention will be understood from the following complete description thereof and from the drawings wherein:

FIG. 9 shows the modification of the E-field of FIG. 5 which would result from the flow of a current $J_3$ due to the punch-through.

COMPLETE DESCRIPTION

Figure 1:
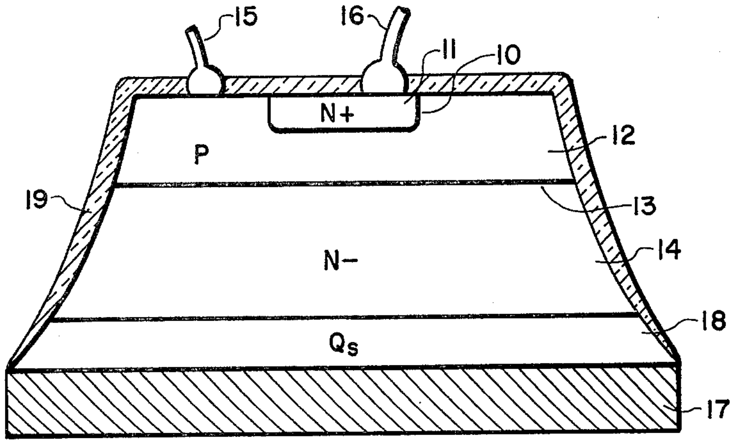
FIG. 1 is a cross-section of one embodiment of the invention.

A mesa type semiconductor device manufactured in accordance with the invention is illustrated in FIG. 1. The semiconductor device includes a first junction 10 between emitter region 11 and base region 12. A second junction 13 is between base region 12 and collector region 14. Contacts 15 and 16 make ohmic contact to the emitter and base regions, respectively. While a refractory metal contact, such as tungsten or molybdenum, 17 makes electrical contact to the collector region. As shall be explained further hereinafter, the collector region has a subregion 18 which is lightly doped, preferably by ion implantation to a level of $10^{12}$ to $10^{13}$ atoms per square centimeter, at the interface between the refractory metal contact 17 and the collector region 14. Preferably, the semiconductor device has a passivation layer 19 over the surface thereof.

Figure 2:
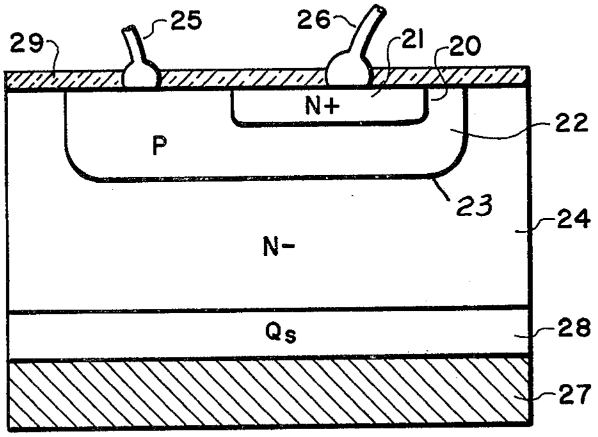
FIG. 2 is a cross-section of another embodiment.

A planar type semiconductor device manufactured in accordance with the invention is illustrated in FIG. 2. The semiconductor device includes a first junction 20 between emitter region 21 and base region 22. A second junction 23 is between base region 22 and collector region 24. Contacts 25 and 26 make ohmic contact to the base and emitter regions, respectively, while a refractory metal contact, such as tungsten or molybdenum, 27 makes electrical contact to the collector region. As shall be explained further hereinafter, the collector region has a subregion 28 which is lightly doped, preferably by ion implantation to a level of $10^{12}$ to $10^{13}$ atoms per square centimeter, at the interface between the refractory metal contact 27 and the collector region 24. Preferably, the semiconductor device has a passivation layer 29 over the surface thereof.

Figure 3:
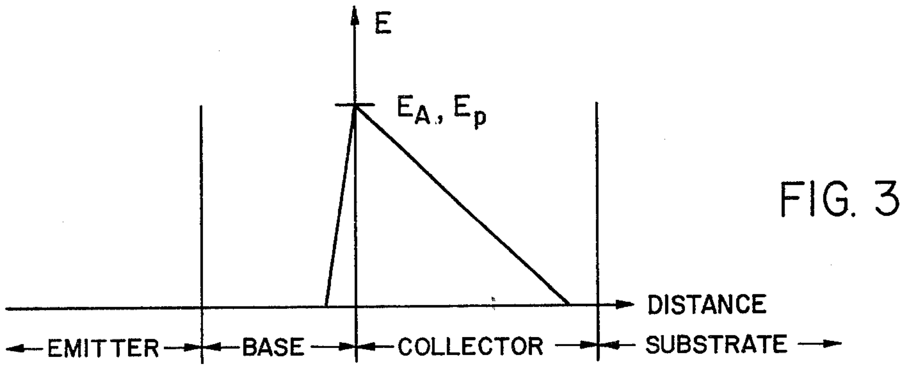
FIG. 3 shows E-field versus distance for a conventional transistor in avalanche.
Figure 4:
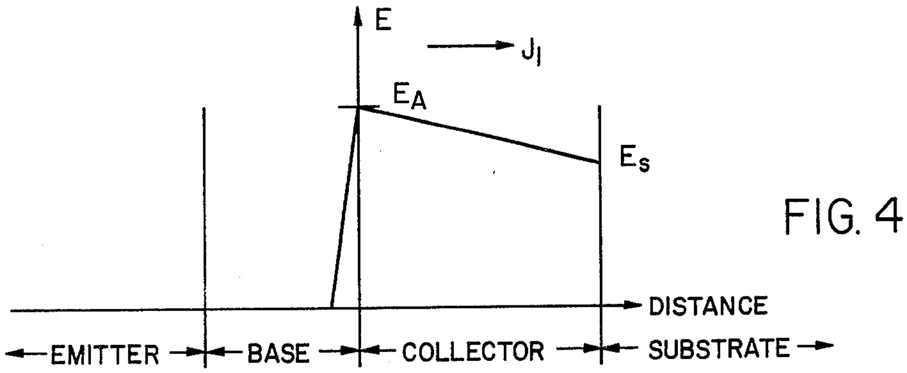
FIG. 4 shows how the avalanche E-field distribution is modified by the passage of a current density $J_1$.
Figure 5:
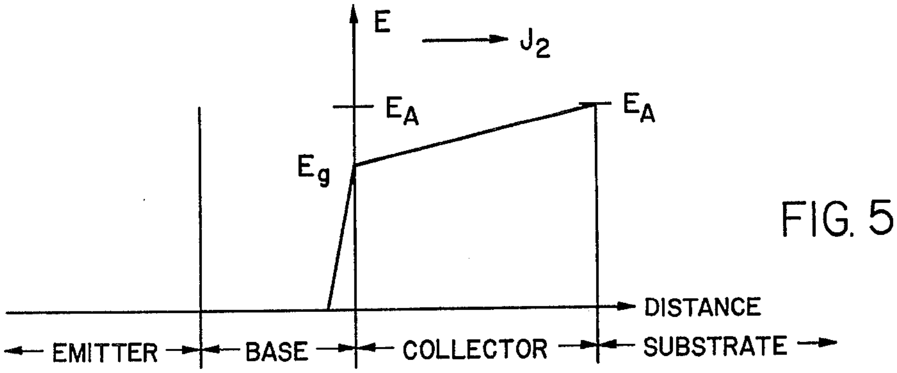
FIG. 5 shows a reversal of the slope of the E-field in the collector region due to the passage of a current density $J_2 > J_1$.

Referring now to FIG. 3, the electric field E in the base and collector regions of a bipolar transistor are shown. Here the peak value $E_p$ of the electric field is that value which just causes avalanche of the transistor, so that the Figure is representative of a very low current density region of operation. If the current density is enhanced, by increasing the applied voltage for example, then minority carriers from the base region enter the collector, where, because of their finite velocity, they tend to neutralize the ionized charges from the shallow impurities which resulted in the E-field distribution of FIG. 3, so that $dE/dx$ is reduced in magnitude. The E-field distribution thus completely penetrates the lightly doped collector regions and the E-field is terminated by the substrate of heavily doped substrate which has the same conductivity type as the collector. Clearly, for a near-constant value of the avalanche field $E_A$, the collector base voltage will be higher for the condition of FIG. 4 than that of FIG. 3. If the current density is increased still further in FIG. 5 to a value $J_2$ which results in an in-transit charge density greater than the charge density due to the ionized shallow impurities, then the sign of $dE/dx$ will be reversed, because of the opposite signing of the charges. It will be appreciated that the current density can be increased to the point where the avalanche field E now occurs at the collector-substrate interface rather than at the collector-base junction. If $dE/dx$ in FIG. 5 is sufficiently large that the junction E-field $E_j$ is less than the collector-substrate E-field $E_s$ in FIG. 4, then the voltage sustained in the mode represented by FIG. 5 is less than that represented by FIG. 4, and further increases in current density will serve to lower the voltage even more, since the E-field cannot increase beyond the avalanche value $E_A$. Thus, a negative resistance mode ensues, whereby the current density increases, the E-field is peaked at the avalanche value near the collector-substrate interface, and the collector-base voltage can become quite small compared with the normal low-current avalanche breakdown voltage. Since the first region of the transistor to reach the critical current density $J_c$ beyond which a change in the sign of $dE/dx$ occurs is the first to suffer voltage collapse, the negative resistance phenomena can be very localized and result in extremely rapid burn-out of structures under conditions of simultaneous high-current and high-voltage. While the voltage at which the negative resistance ensues can be raised by augmenting the thickness of the collector region, this will also increase the saturation resistance of the transistor. Further, the critical current density $J_c$ for the onset of the negative resistance can be increased by augmenting the doping in the collector region, this approach cannot be carried very far without seriously degrading the low-current avalanche breakdown voltage. Thus, a means for homogenizing the current density under breakdown conditions is highly desirable.

Figure 6:
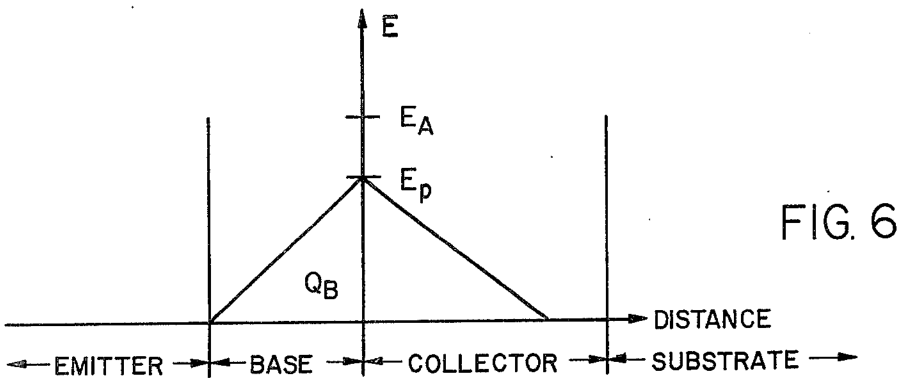
FIG. 6 shows the E-field distribution for a transistor whose breakdown is limited by base-punch-through prior to avalanche breakdown.

One such approach was discussed in U.S. Pat. No. 3,758,831 and is summarized in FIG. 6. Here the integrated base doping $Q_B$ is made sufficiently low such that the transistor breaks down by electrical punch-through of the base before the peak value of the E-field has reached the avalanche value. The electrical punch-through tends to homogenize the current density and results in improved reverse-biased performance. One severe disadvantage of this approach is, that as is well known, the transistor current gain is inversely proportional to $Q_B$, and reducing $Q_B$ to the level required to induce punch-through of the base, or primary punch-through, may raise the gain to inacceptably high levels. At the very least, the ability to achieve independent control of the current gain is substantially impaired.

Figure 7:
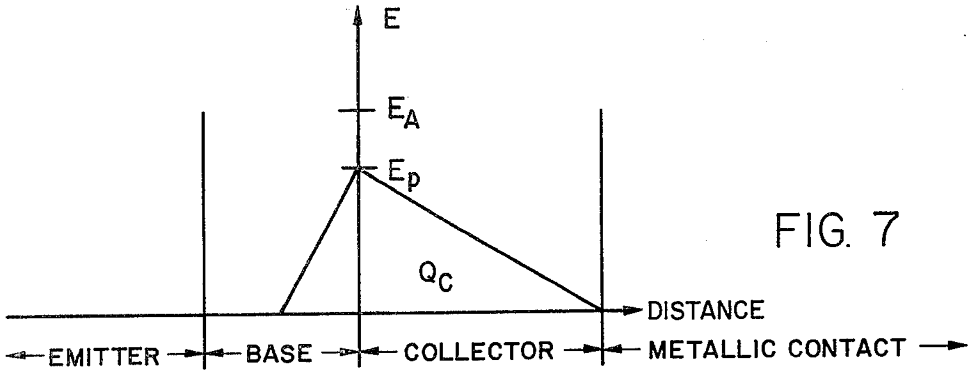
FIG. 7 shows the E-field distribution for a transistor whose breakdown is limited by collector punch-through to a metallic collector contact prior to avalanche breakdown.
Figure 8:
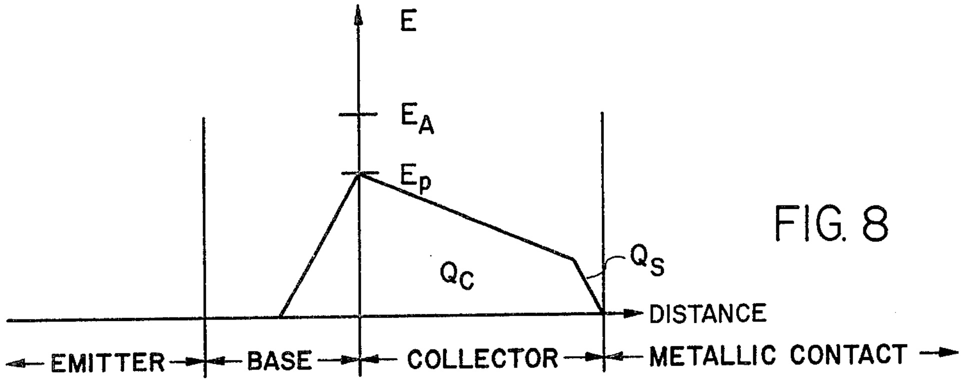
FIG. 8 is similar to FIG. 5 but additionally shows the influence of a narrow, relatively heavily doped collector region adjacent the collector metallic contact.

FIGS. 7 and 8 depict ways to achieve punch-through without the undesirable side effects described above. In FIG. 7, the heavily doped substrate has been replaced by a metallic contact, which has the property that when the E-field reaches the collector metal boundary, a large current density flow will result, and a breakdown will occur for a peak junction E-field $E_p$ less than $E_A$. This is hereinafter referred to as secondary punch-through to differentiate from the base punch-through mode described previously. From Gauss' law, it is clear that the integrated collector doping $$Q_c = \int^{\text{collector}} N_c(x)dx$$

where $N_c(x)$ is the shallow doping density, determines $E_p$ in accordance with the relationship $$E_p = \frac{qQ_c}{E_s}$$

where $q$ is the electron charge and $\epsilon_s$ is the dielectric constant for the semiconductor. Since $Q_c$ depends on both the thickness and the doping of the collector region, it may be in some cases more effective to control $E_p$ to be less than $E_A$ by making $Q_c$ small and adding an additional doped layer of areal concentration $Q_s$ in the vicinity of the semiconductor metal interface. In addition to reducing the tolerances required by $Q_c$, it may be seen that this procedure can minimize the collector thickness required for a given breakdown voltage. That is, if $E_p$ is constrained to be less than $E_A$, the breakdown voltage is maximized for a given collector thickness if E is constant in the collector region.

Figure 9:
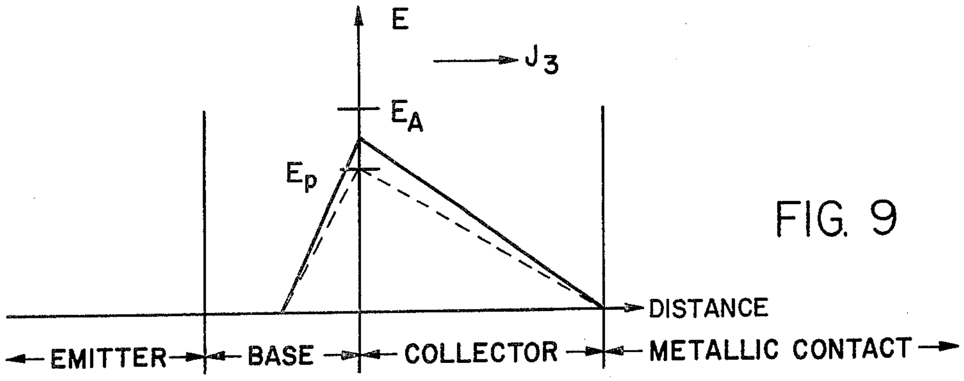

FIG. 9 shows the results of increasing the collector current density in the case where secondary punch-through is provided by a structure whose low-current density breakdown is depicted in FIG. 7. The E-field cannot be raised substantially above zero at the collector-metallic contact boundary, and the E-field elicits minority carrier flow from the metallic contact, such carriers being the same charge sign as shallow ionized collector impurities.

Thus, the magnitude of $dE/dx$ is increased, so that the voltage is increased across the region where secondary punch-through occurs. This E-field distribution of FIG. 7 is shown dashed in FIG. 9 for comparison.

In silicon, the avalanche field ranges from about 10 to 60 volts per micron depending on the doping level. According to Gauss' law, 16 volts per micron would be terminated by an areal charge density of $10^{12}$ $cm^{-2}$. Thus, a charge $Q_s$ of this magnitude can serve to provide for a controllable secondary punch-through according to the relation:

$$E_A > E_p = \frac{q(Q_c + Q_s)}{E_s}$$

Ion implantation is an obvious way to provide such a low $Q_s$ controllably.

In a case like FIG. 7, any metal can be used to provide the punch-through function, but clearly to achieve reasonable saturation voltages, one should either choose a metal having a low barrier height to the collector, or use a very high concentration layer to achieve the desired $Q_S$.

While the invention has been described in relation to a preferred embodiment thereof, those skilled in the art will recognize that various changes may be made to suit specific requirements without departing from the scope of the invention.

What is claimed is:

1. A semiconductor device with improved reverse transient capability comprising a first and a second junction between emitter base and collector regions, the collector region being lightly doped to a level of $10^{12}$ to $10^{13}$ atoms per square centimeter and a refractory metal contact to said collector thereby providing uniform turn-off power dissipation.

2. A semiconductor device as recited in claim 1 wherein at least one of said junctions extends to the periphery of the device.

3. A semiconductor device as recited in claim 2 wherein the edges of the device are tapered.

4. A semiconductor device as recited in claim 1 wherein said first and second junctions extend to a planar surface of the device.

* * * * *